(12) United States Patent
Chang

(10) Patent No.: US 8,836,565 B1
(45) Date of Patent: Sep. 16, 2014

(54) ANALOG TO DIGITAL CONVERTER AND SIGNAL CONVERTING METHOD

(71) Applicant: Mediatek Inc., Hsin-Chu (TW)

(72) Inventor: Wen-Hua Chang, Hsinchu County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/038,776

(22) Filed: Sep. 27, 2013

(51) Int. Cl.
*H03M 1/12* (2006.01)

(52) U.S. Cl.
CPC ..................... *H03M 1/124* (2013.01)
USPC ............ 341/155; 341/161; 341/162; 341/172

(58) Field of Classification Search
CPC .......... H03M 1/34; H03M 1/42; H03M 1/442
USPC .......................... 341/155, 158, 161–162, 172
See application file for complete search history.

(56) References Cited

U.S. PATENT DOCUMENTS

| | | | | |
|---|---|---|---|---|
| 5,574,457 A | * | 11/1996 | Garrity et al. | 341/172 |
| 6,362,770 B1 | * | 3/2002 | Miller et al. | 341/172 |
| 6,801,151 B1 | * | 10/2004 | Opris | 341/161 |
| 6,967,611 B2 | * | 11/2005 | Atriss et al. | 341/172 |
| 7,259,709 B2 | * | 8/2007 | Ogita et al. | 341/172 |

* cited by examiner

*Primary Examiner* — Khai M Nguyen
(74) *Attorney, Agent, or Firm* — Winston Hsu; Scott Margo

(57) ABSTRACT

An analog to digital converter can operate in a sampling mode or in a comparing mode. The analog to digital converter comprises: a comparator; a first capacitor, comprising a first terminal coupled to a first input terminal of the comparator; a second capacitor; a first switch module; a control unit, for controlling the conductive states of the first switch module corresponding to the sampling mode or the comparing mode. The first capacitor samples a value of a first input signal and the second capacitor samples a value of a first reference signal via the first switch module in the sampling mode. The first capacitor and the second capacitor are not coupled to each other in the sampling mode. The first capacitor and the second capacitor are coupled in series via the first switch module in the comparing mode.

11 Claims, 10 Drawing Sheets

ANALOG TO DIGITAL CONVERTER AND SIGNAL CONVERTING METHOD

BACKGROUND

FIG. 1 is a circuit diagram illustrating a related art sub-ADC (analog to digital converter). The sub-ADC is an essential building block in pipeline ADCs, since the flash type thereof is a good candidate for high speed applications. In FIG. 1, the MDAC 101 and the sub-ADC 103 take place of the traditional Sample/Track and Hold stage to save power. But the sampling skew between the MDAC 101 and the sub-ADC 103 becomes crucial in this case. To solve this issue, in a sampling period, the sampling capacitors $C_1$-$C_4$ in the MDAC 101 and the sub-ADC 103 will sample the input signal $S_{ip}$, $S_{in}$ at the same time, meanwhile, extra sampling capacitors $C_5$, $C_6$ in the sub-ADC 103 will sample the corresponding reference signals $S_{r1}$, $S_{r2}$, which can be constant voltages. And in the hold period, the two pairs of sampling capacitors $C_3$-$C_6$ in the sub-ADC 103 will shunt together such that the comparing module 105 can get the voltage difference between the input signals $S_{ip}$, $S_{in}$ and the reference signals $S_{r1}$, $S_{r2}$. But above operation will divide the voltage difference by 2 because the charge difference will be shared by two capacitors. Also, the sub ADC 103 needs more time to wait for the charge redistribution in two sampling capacitors.

SUMMARY

Therefore, one objective of the present application is to provide an analog to digital converter that will cause no voltage difference dividing and charge redistribution.

Another objective of the present application is to provide a signal converting method that will cause no voltage difference dividing and charge redistribution.

One embodiment of the present application discloses an analog to digital converter, which can operate in a sampling mode or in a comparing mode. The analog to digital converter comprises: a comparator, comprising a first input terminal; a first capacitor, comprising a first terminal coupled to the first input terminal; a second capacitor; a first switch module, coupled to a second terminal of the first capacitor and a first terminal of the second capacitor; a control unit, for controlling the conductive states of the first switch module corresponding to the sampling mode or the comparing mode. The first capacitor samples a value of a first input signal and the second capacitor samples a value of a first reference signal via the first switch module in the sampling mode. The first capacitor and the second capacitor are not coupled to each other in the sampling mode. The first capacitor and the second capacitor are coupled in series via the first switch module in the comparing mode.

Another embodiment of the present application discloses a signal converting method for an analog to digital converter can operate in a sampling mode or in a comparing mode. The digital converter comprises a comparator, a first capacitor coupled to a first input terminal of the comparator, a second capacitor and a first switch module. The method comprises: controlling the conductive states of the first switch module corresponding to the sampling mode, thereby the first capacitor samples a value of a first input signal and the second capacitor samples a value of a first reference signal via the first switch module in the sampling mode; controlling the conductive states of the first switch module corresponding to the sampling mode, thereby the first capacitor and the second capacitor are not coupled to each other in the sampling mode; and controlling the conductive states of the first switch module corresponding to the comparing mode, thereby the first capacitor and the second capacitor are coupled in series via the first switch module in the comparing mode.

In view of above-mentioned embodiments, since the capacitors are coupled in series rather than shunt in the sampling mode, the voltage difference is not divided by 2, and there is no charge redistribution action between two capacitors. By this way, settling time can be saved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
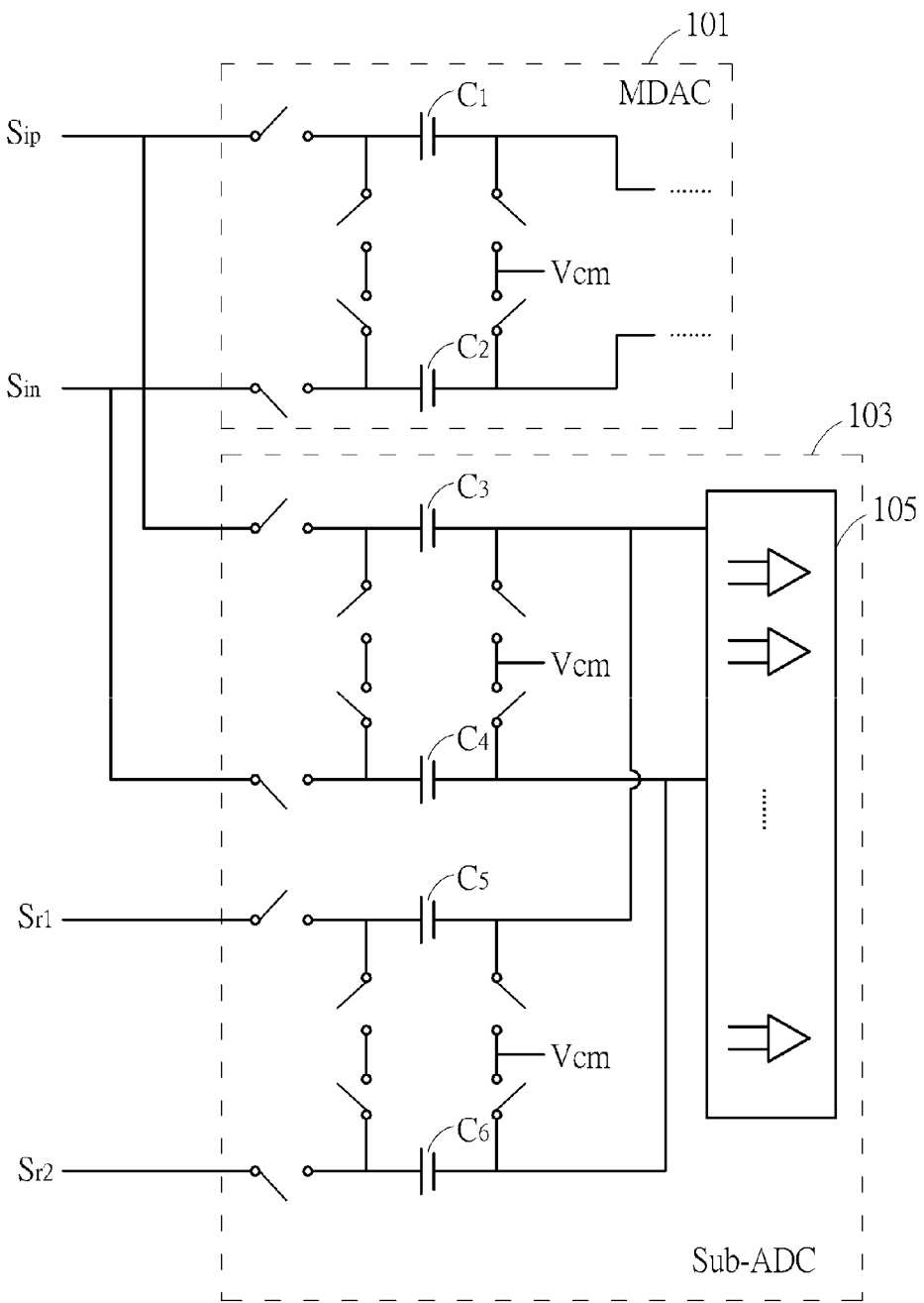
FIG. 1 is a circuit diagram illustrating a related art analog to digital converter.

The analog to digital converter according to the embodiments of the present application will be described in following description. Please note that the analog to digital converter according to the embodiments of the present application can be applied to a sub-ADC as shown in FIG. 1 to compare the input signal $S_{in}$, $S_{ip}$ and the reference signal $S_r$, but can also be applied to other circuits. Also, the structures and the operations for the analog to digital converter according to the embodiments of the present application are not limited to the following embodiments.

Figure 2:
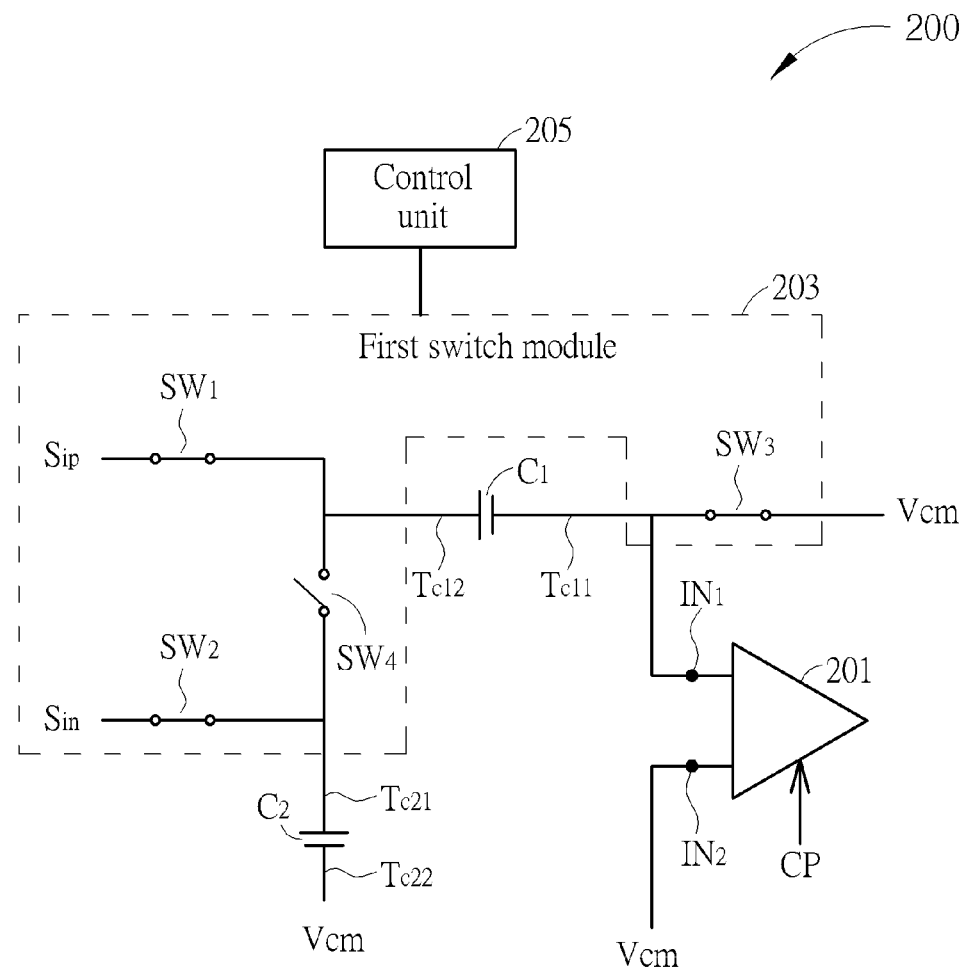
FIG. 2-FIG. 4 are circuit diagrams illustrating the analog to digital converter according to one embodiment of the present application.
Figure 3:
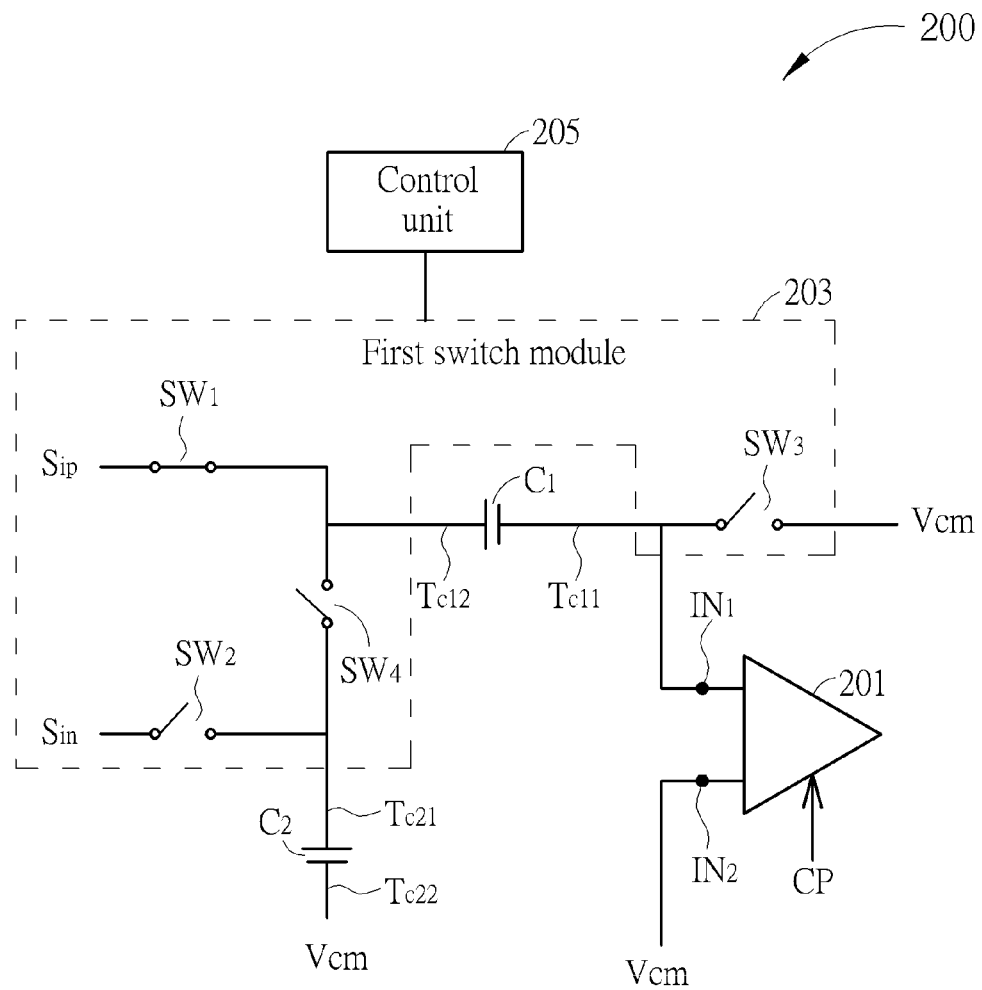
Figure 4:
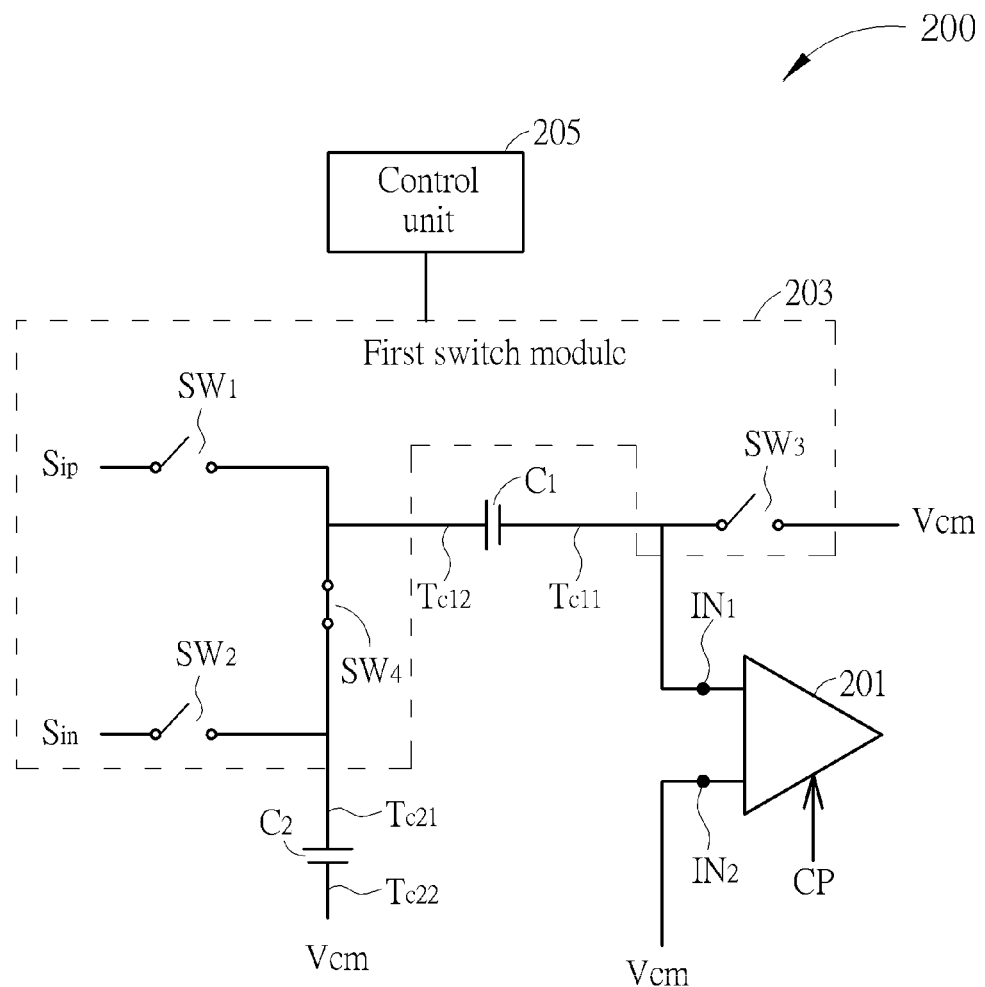
Figure 5:
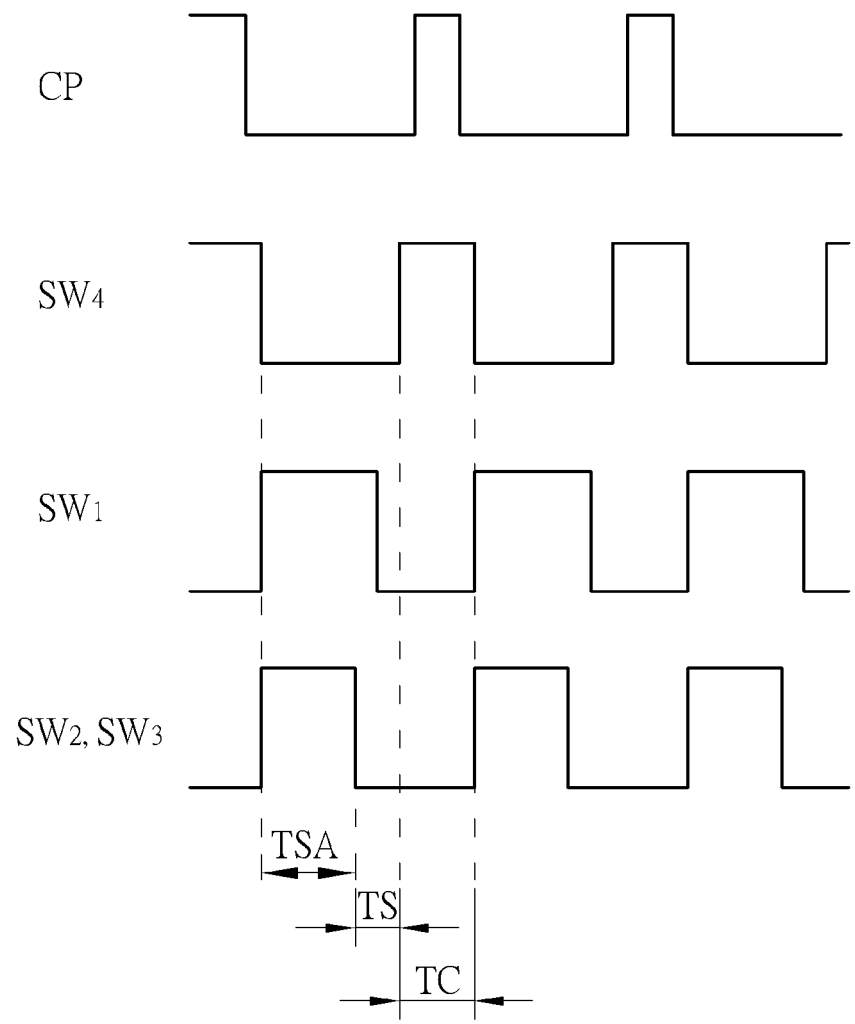
FIG. 5 is a timing diagram illustrating the operations for the analog to digital converter described in FIG. 2-FIG. 4.

FIG. 2-FIG. 4 are circuit diagrams illustrating the analog to digital converter according to one embodiment of the present application. FIG. 5 is a timing diagram illustrating the operations for the analog to digital converter described in FIG. 2-FIG. 4. The analog to digital converter 200 in FIG. 2-FIG. 4 has the same circuit structure but operate in different modes. Please refer to both the circuit diagrams in FIG. 2-4 and the timing diagram in FIG. 5 to understand the concept of the present application for more clear.

The analog to digital converter 200 operates in a sampling mode in FIG. 2 (corresponding to the time period TSA in FIG. 5), operates in a switching mode in FIG. 3 (corresponding to the time period TS in FIG. 5) and operates in a comparing mode in FIG. 4 (corresponding to the time period TC in FIG. 5). The analog to digital converter 200 comprises a comparator 201, a first switch module 203, a control unit 205, a first capacitor $C_1$, and a second capacitor $C_2$. The comparator 201 comprises a first input terminal $IN_1$ and a second input terminal $IN_2$. The first capacitor $C_1$ comprises a first terminal $T_{C11}$ coupled to the first input terminal $IN_1$. The first switch module 203 is coupled to a second terminal $T_{C12}$ of the first capacitor $C_1$ and a first terminal $T_{C21}$ of the second capacitor $C_2$. The control unit 205 controls the conductive states of the first switch module 203 corresponding to different modes, which will described for more detail later. Also, a second terminal $T_{C21}$ of the second capacitor $C_2$ is coupled to the predetermined voltage level $V_{cm}$.

In one embodiment, the first switch module 203 comprises a first switch $SW_1$, a second switch $SW_2$, a third switch $SW_3$, and a fourth switch $SW_4$. The first switch $SW_1$ is coupled to the second terminal $T_{C12}$ of the first capacitor $C_1$. The second switch $SW_2$ is coupled to the first terminal $T_{C21}$ of the second capacitor $C_2$. The third switch $SW_3$ is coupled to the first terminal $T_{C11}$ of the first capacitor $C_1$. The fourth switch $SW_4$ is coupled between the second terminal $T_{C11}$ of the first capacitor $C_1$ and the first terminal $T_{C12}$ of the second capacitor $C_2$.

As above-mentioned, the analog to digital converter 200 operates in a sampling mode in FIG. 2 (the time period TSA in FIG. 5). In this mode, the first switch $SW_1$, the second switch $SW_2$, and the second switch $SW_3$ are conductive (high logic level in FIG. 5), and the fourth switch $SW_4$ is non-conductive (low logic level in FIG. 5). By this way, the first capacitor $C_1$ and the second capacitor $C_2$ are pre-charged by the first predetermined voltage level $V_{cm}$. After that, the value of the first input signal $S_{f1}$ is sampled by the first capacitor $C_1$, and the value of the first reference signal $S_{r1}$ is sampled by the second capacitor $C_2$.

After the sampling mode, the analog to digital converter 200 enters the switching mode (corresponding to the time period TS in FIG. 5). In the switching mode, the second switch $SW_2$ and the third switch $SW_3$ firstly become non-conductive, as shown in FIG. 3, and then the first switch $SW_1$ becomes non-conductive.

After the switching mode, the fourth switch $SW_4$ becomes conductive to enter the comparing mode (the time period TC in FIG. 5), as shown in FIG. 4. In the comparing mode, the first capacitor $C_1$ and the second capacitor $C_2$ are coupled in series such that the voltage difference for the values of the first input signal $S_{f1}$ and the first reference signal $S_{r1}$ sampled in the sampling mode is generated at the first input terminal $IN_1$. After that, a comparing activating signal CP goes high such that the comparator 201 latches the voltage difference and performs comparing operation. Please note the fourth switch $SW_4$ becomes conductive later than the first switch $SW_1$ becomes non-conductive at the edge of the time period TS and the time period TC in FIG. 5, but the fourth switch $SW_4$ can become conductive at the same timing that the first switch $SW_1$ becomes non-conductive. Also, please note although the fourth switch $SW_4$ becomes non-conductive at a timing the same as the timing that the first switch $SW_1$, the second switch $SW_2$, and the third switch $SW_3$ become conductive at the ending of the time period TC in FIG. 5, the fourth switch $SW_4$ can become non-conductive later than the timing that the first switch $SW_1$, the second switch $SW_2$, and the third switch $SW_3$ become conductive.

Figure 6:
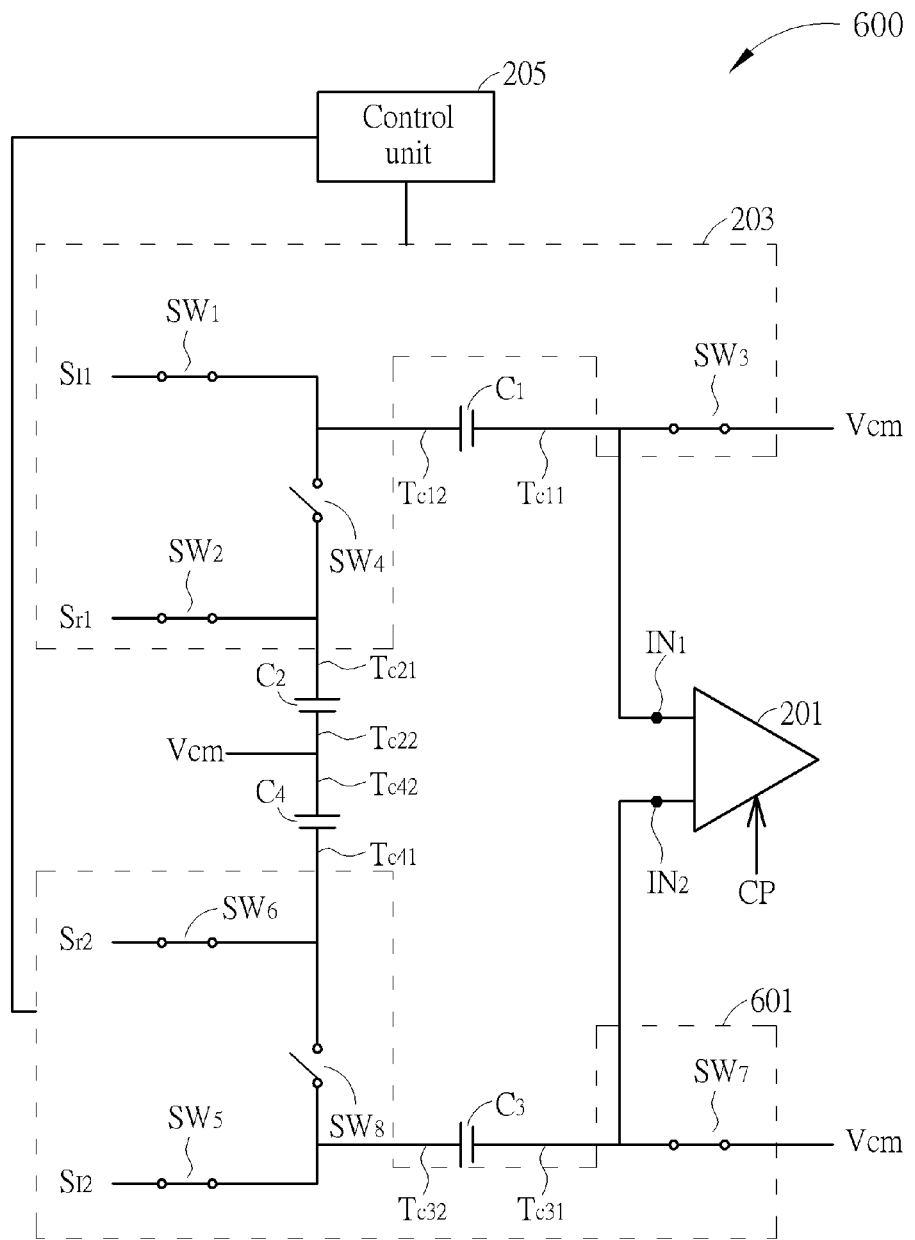
FIG. 6-FIG. 8 are circuit diagrams illustrating the analog to digital converter according to another embodiment of the present application.
Figure 7:
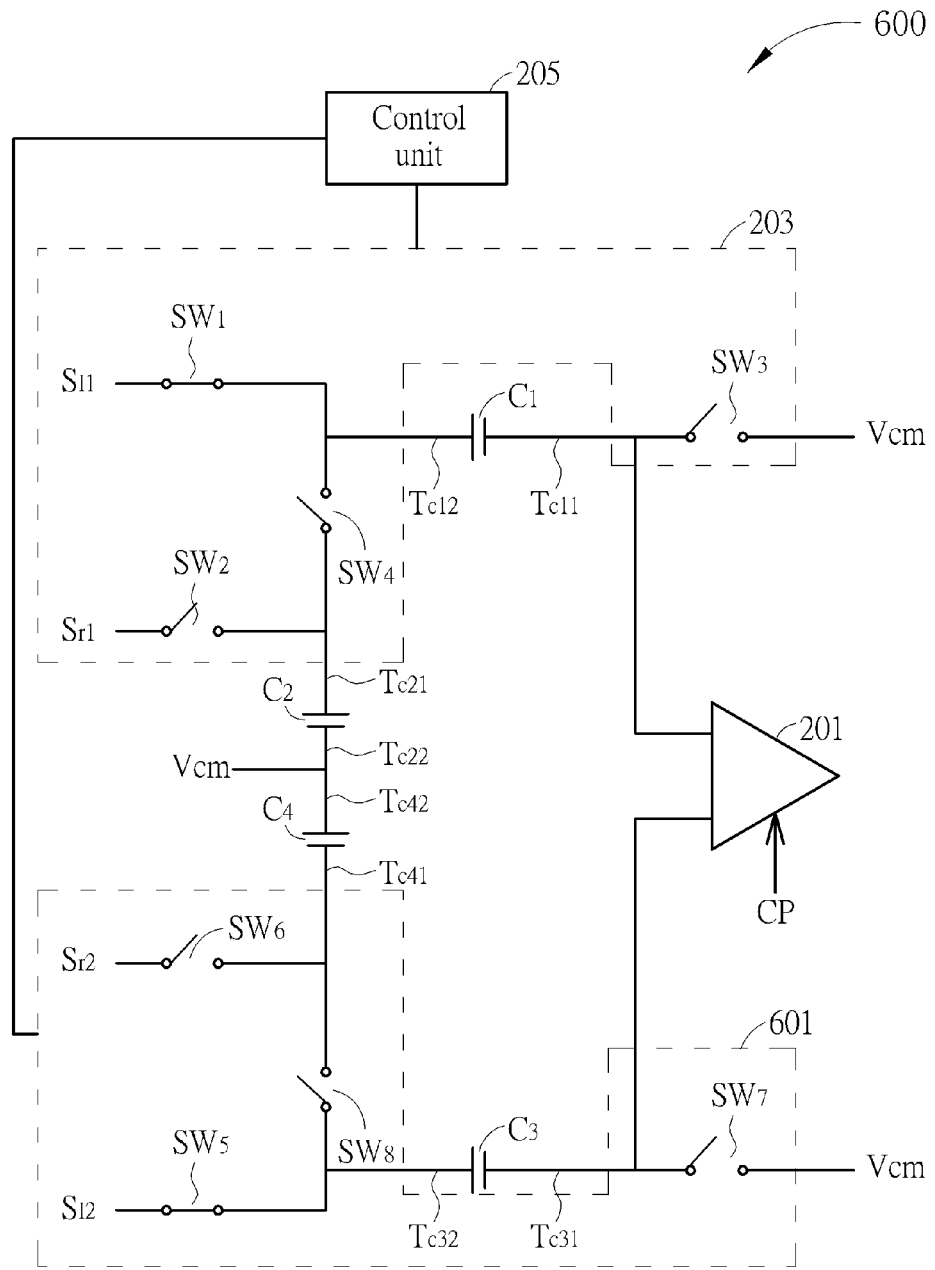
Figure 8:
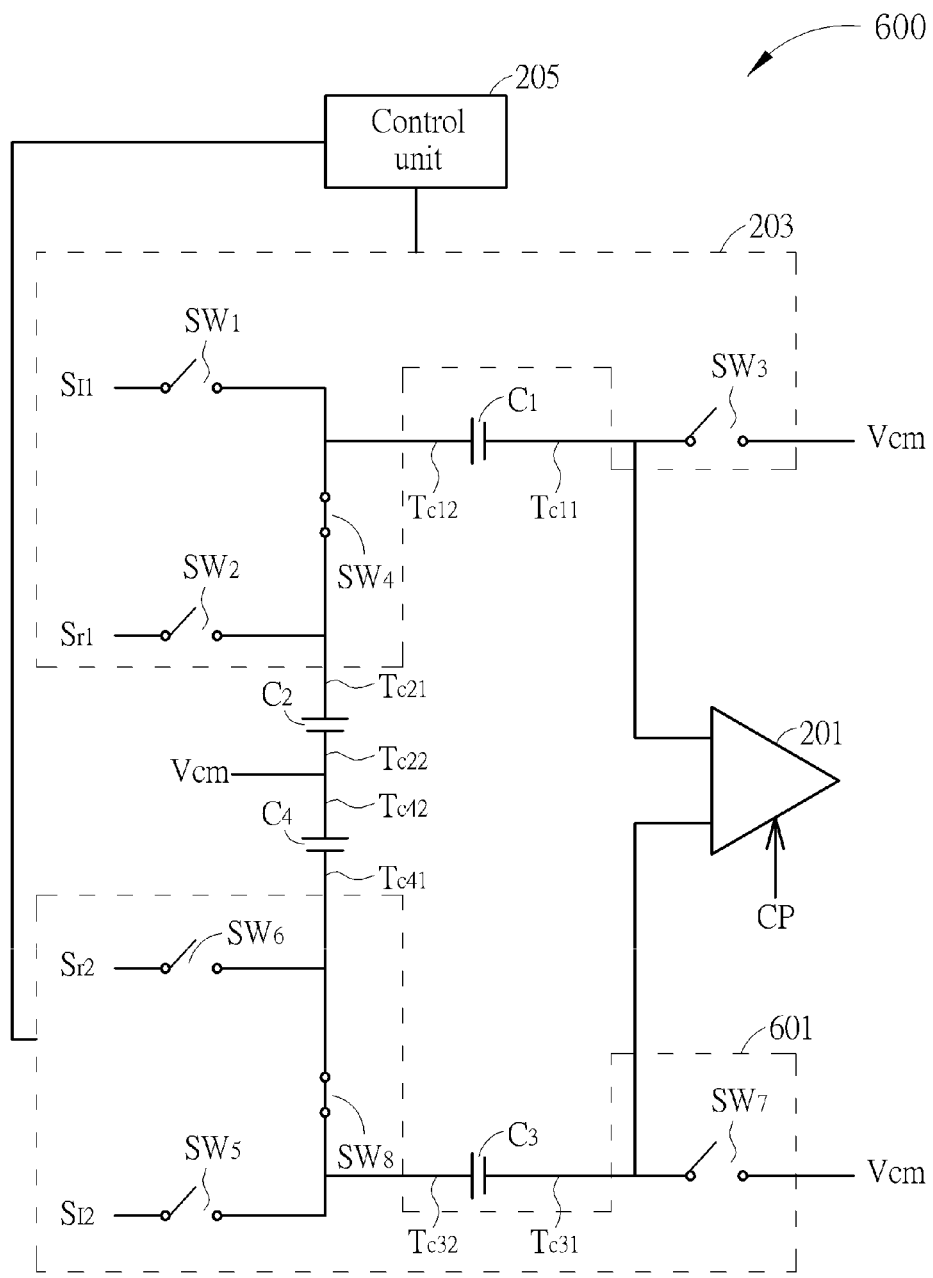

FIG. 6-FIG. 8 are circuit diagrams illustrating the analog to digital converter according to another embodiment of the present application. Please note if the embodiments in FIG. 6-FIG. 8 are applied to the circuit diagram in FIG. 1, the first, second input signals $S_{f1}$, $S_{f2}$ in FIG. 6-FIG. 8 correspond to the signals $S_{ip}$, $S_{in}$ in FIG. 1, and the reference signals $S_{r1}$, $S_{r2}$ in FIG. 6-FIG. 8 correspond to the reference signals $S_{r1}$, $S_{r2}$ in FIG. 1. However, it does not mean to the embodiments in FIG. 6-FIG. 8 are limited to be applied to the circuit diagram in FIG. 1. The same as the analog to digital converter 200 in FIG. 2-FIG. 4, the analog to digital converter 600 also comprises a comparator 201, a first switch module 203, a control unit 205, a first capacitor $C_1$, and a second capacitor $C_2$. The analog to digital converter 600 further comprises a second switch module 601 coupled to the second input terminal $IN_2$, a third capacitor $C_3$, and a second capacitor $C_4$. Also, the second switch module 601 comprises a fifth switch $SW_5$, a sixth switch $SW_7$, a seventh switch $SW_7$, and an eighth switch $SW_8$. The structures and operations for the third capacitor $C_3$, the fourth capacitor $C_4$, the fifth switch $SW_5$, the sixth switch $SW_7$, the seventh switch $SW_7$, and the eighth switch $SW_8$ are the same as which of the first capacitor $C_1$, the second capacitor $C_2$, the first switch $SW_4$, the second switch $SW_2$, the third switch $SW_3$, and the fourth switch $SW_4$. Specifically, the third capacitor $C_3$ corresponds to the first capacitor $C_1$, the fourth capacitor $C_4$ corresponds to the second capacitor $C_2$, the fifth switch $SW_5$ corresponds to the first switch $SW_1$, the sixth switch $SW_6$ corresponds to the second switch $SW_2$, the seventh switch $SW_7$ corresponds to the third switch $SW_3$, and the eighth switch $SW_8$ corresponds to the fourth switch $SW_4$.

Similar with the operation described in FIG. 2, in the sampling mode, the first switch $SW_1$/the fifth switch $SW_5$, the second switch $SW_2$/the sixth switch $SW_6$, and the third switch $SW_3$/the seventh switch $SW_7$ are conductive, and the fourth switch $SW_4$/the eighth switch $SW_8$ are nonconductive, as shown in FIG. 6. Also, similar with the operation described in FIG. 3, in the switching mode, the second switch $SW_2$/the sixth switch $SW_6$, the third switch $SW_3$/the seventh switch $SW_7$ become non-conductive first and then the first switch $SW_1$/the fifth switch $SW_5$ become non-conductive, as shown in FIG. 7. Additionally, similar with the operation described in FIG. 4, in the comparing mode, the first switch $SW_1$/the fifth switch $SW_5$, the second switch $SW_2$/the sixth switch $SW_6$, and the third switch $SW_3$/the seventh switch $SW_7$ are non-conductive, and the fourth switch $SW_4$/the eighth switch $SW_8$ are conductive, as shown in FIG. 8.

Figure 9:
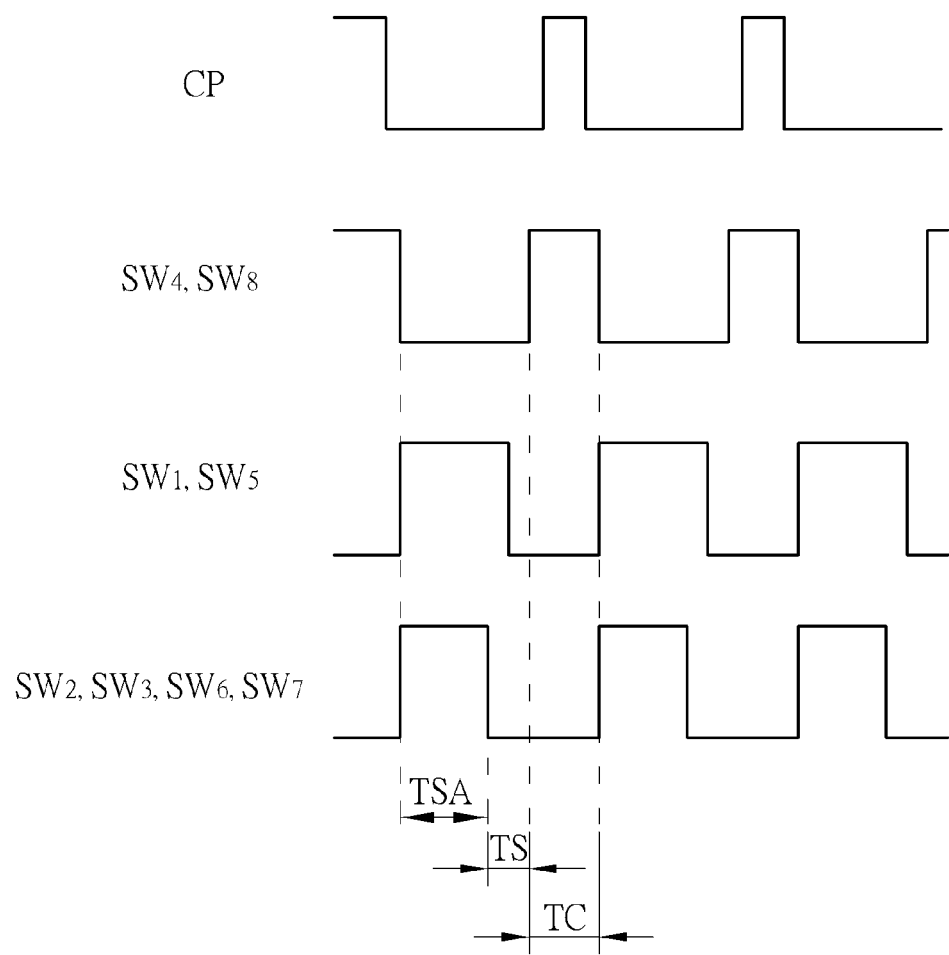
FIG. 9 is a timing diagram illustrating the operations for the analog to digital converter described in FIG. 6-FIG. 8.

FIG. 9 is a timing diagram illustrating the operations for the analog to digital converter described in FIG. 6-FIG. 8. The detail operations for the embodiments described in FIG. 6-FIG. 8, FIG. 9 can be acquired based on the description for FIG. 2-FIG. 5, thus are omitted for brevity here.

Figure 10:
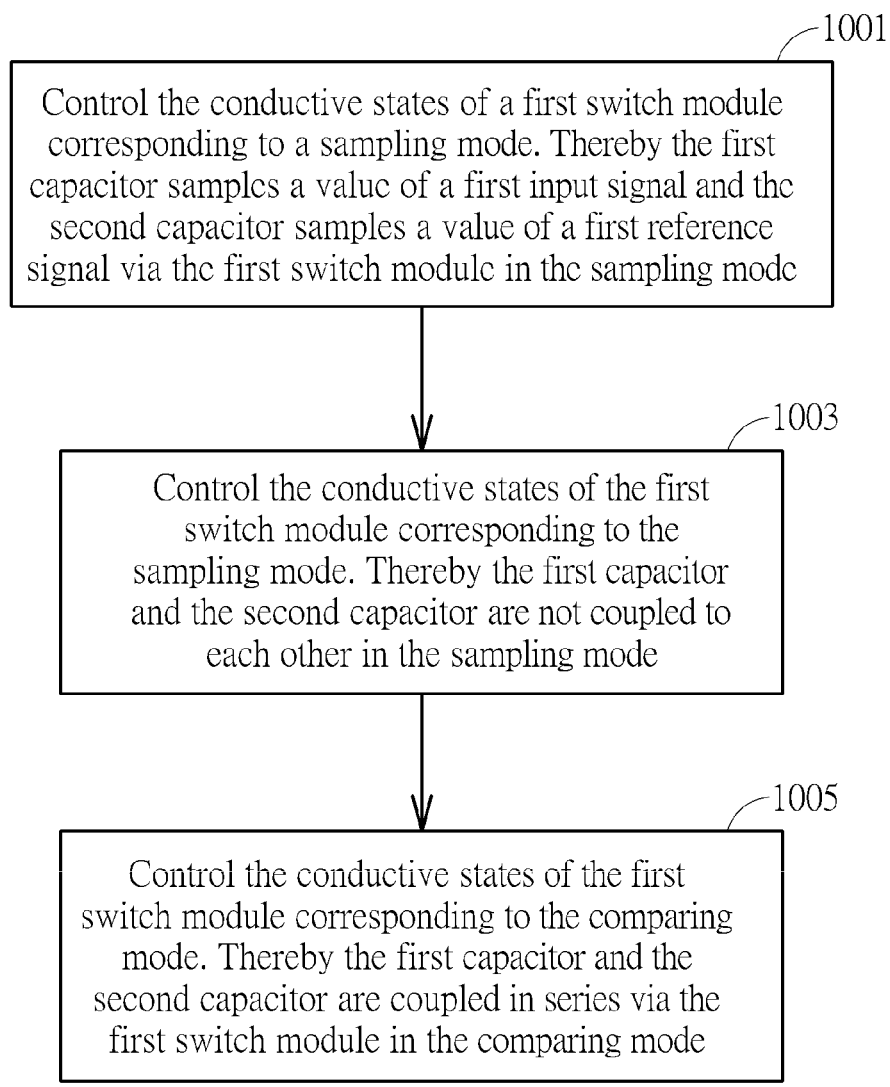
FIG. 10 is a flow chart illustrating a signal converting method according to an embodiment of the present application.

In view of above-mentioned embodiments, a signal converting method can be acquired. Please note the steps are not limited in the following order. FIG. 10 is a flow chart illustrating a signal converting method according to an embodiment of the present application, which includes the following steps:

Step 1001

Control the conductive states of a first switch module (ex. 203) corresponding to a sampling mode. Thereby the first capacitor (ex. C1) samples a value of a first input signal and the second capacitor samples a value of a first reference signal via the first switch module in the sampling mode.

Step 1003

Control the conductive states of the first switch module corresponding to the sampling mode. Thereby the first capacitor and the second capacitor are not coupled to each other in the sampling mode.

Step 1005

Control the conductive states of the first switch module corresponding to the comparing mode. Thereby the first capacitor and the second capacitor are coupled in series via the first switch module in the comparing mode.

In view of above-mentioned embodiments, since the capacitors are coupled in series rather than shunt in the sampling mode, the voltage difference is not divided by 2, and there is no charge redistribution action between two capacitors. By this way, settling time can be saved.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. An analog to digital converter, capable of operating in a sampling mode or in a comparing mode, comprising:
   a comparator, comprising a first input terminal;
   a first capacitor, comprising a first terminal coupled to the first input terminal;
   a second capacitor;
   a first switch module, coupled to a second terminal of the first capacitor and a first terminal of the second capacitor;
   a control unit, for controlling the conductive states of the first switch module corresponding to the sampling mode or the comparing mode;
   wherein the first capacitor samples a value of a first input signal and the second capacitor samples a value of a first reference signal via the first switch module in the sampling mode;
   where the first capacitor and the second capacitor are not coupled to each other in the sampling mode;
   wherein the first capacitor and the second capacitor are coupled in series via the first switch module in the comparing mode.

2. The analog to digital converter of claim 1, wherein a second terminal of the second capacitor is coupled to a predetermined voltage level; where the first terminal of the first capacitor is coupled to the predetermined voltage level via the first switch module in the sampling mode; wherein the first terminal of the first capacitor is not coupled to the predetermined voltage level in the comparing mode.

3. The analog to digital converter of claim 2, wherein the comparator further comprises a second input terminal coupled to the predetermined voltage level.

4. The analog to digital converter of claim 2, wherein the first switch module comprises:
   a first switch, coupled to the second terminal of the first capacitor, wherein the first capacitor receives the first input signal if the first switch is conductive;
   a second switch, coupled to the first terminal of the second capacitor, wherein the second capacitor receives the first reference signal if the second switch is conductive;
   a third switch, coupled to the first terminal of the first capacitor, wherein the first capacitor receives the predetermined voltage level if the third switch is conductive; and
   a fourth switch, coupled between the second terminal of the first capacitor and the first terminal of the second capacitor;
   wherein the first switch, the second switch and the third switch are conductive in the sampling mode, and are non-conductive in the comparing mode;
   where the fourth switch is conductive in the comparing mode.

5. The analog to digital converter of claim 2, capable of operating in a switching mode between the sampling mode and comparing mode, wherein the second switch and the third switch firstly become non-conductive and then the first switch becomes non-conductive in the switching mode.

6. The analog to digital converter in claim 1, wherein the comparator further comprises a second input terminal, where the analog to digital converter further comprises:
   a third capacitor, comprising a first terminal coupled to the second input terminal;
   a fourth capacitor;
   a second switch module, coupled to a second terminal of the third capacitor and a first terminal of the fourth capacitor, wherein the control unit controls the conductive states of the second switch module corresponding to the sampling mode or the comparing mode;
   wherein the third capacitor samples a value of a second input signal and the fourth capacitor samples a value of a second reference signal via the second switch module in the sampling mode;
   where the third capacitor and the fourth capacitor are not coupled to each other in the sampling mode;
   wherein the third capacitor and the fourth capacitor are coupled in series via the second switch module in the comparing mode.

7. The analog to digital converter in claim 6, wherein a second terminal of the fourth capacitor is coupled to the predetermined voltage level; where the first terminal of the third capacitor is coupled to the predetermined voltage level via the second switch module in the sampling mode; wherein the first terminal of the third capacitor is not coupled to the predetermined voltage level in the comparing mode.

8. The analog to digital converter in claim 7, wherein the second switch module comprises:
   a fifth switch, coupled to the second terminal of the third capacitor, wherein the third capacitor receives the second input signal if the fifth switch is conductive;
   a sixth switch, coupled to the first terminal of the fourth capacitor, wherein the fourth capacitor receives the second reference signal if the sixth switch is conductive;
   a seventh switch, coupled to the first terminal of the third capacitor, wherein the third capacitor receives the predetermined voltage level if the seventh switch is conductive; and
   an eighth switch, coupled between the second terminal of the third capacitor and the first terminal of the fourth capacitor;
   wherein the fifth switch, the sixth switch and the seventh switch are conductive in the sampling mode, and are non-conductive in the comparing mode;
   where the eighth switch is conductive in the comparing mode.

9. The analog to digital converter in claim 7, capable of operating in a switching mode between the sampling mode and comparing mode, wherein the sixth switch and the seventh switch firstly become non-conductive and then the fifth switch becomes non-conductive in the switching mode.

10. A signal converting method for an analog to digital converter can operate in a sampling mode or in a comparing mode, wherein the digital converter comprises a comparator, a first capacitor coupled to a first input terminal of the comparator, a second capacitor and a first switch module, wherein the method comprises:
    controlling the conductive states of the first switch module corresponding to the sampling mode, thereby the first capacitor samples a value of a first input signal and the second capacitor samples a value of a first reference signal via the first switch module in the sampling mode;
    controlling the conductive states of the first switch module corresponding to the sampling mode, thereby the first capacitor and the second capacitor are not coupled to each other in the sampling mode; and
    controlling the conductive states of the first switch module corresponding to the comparing mode, thereby the first capacitor and the second capacitor are coupled in series via the first switch module in the comparing mode.

11. The signal converting method in claim 10, wherein the comparator further comprises a second input terminal, where the analog to digital converter further comprises a third capacitor, a fourth capacitor, a second switch module, wherein the method comprises:
- controlling the conductive states of the second switch module corresponding to the sampling mode, thereby the third capacitor samples a value of a second input signal and the second capacitor samples a value of a second reference signal via the second switch module in the sampling mode,
- controlling the conductive states of the second switch module corresponding to the sampling mode, thereby the third capacitor and the fourth capacitor are not coupled to each other in the sampling mode; and
- controlling the conductive states of the second switch module corresponding to the comparing mode, thereby the third capacitor and the fourth capacitor are coupled in series via the second switch module in the comparing mode.

* * * * *